(12) United States Patent
Lim et al.

(10) Patent No.: US 10,580,779 B2
(45) Date of Patent: Mar. 3, 2020

(54) VERTICAL TRANSISTOR STATIC RANDOM ACCESS MEMORY CELL

(71) Applicant: GLOBALFOUNDRIES Inc., Grand Cayman (KY)

(72) Inventors: Kwan-Yong Lim, Niskayuna, NY (US); Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 27 days.

(21) Appl. No.: 15/903,203

(22) Filed: Feb. 23, 2018

(65) Prior Publication Data

US 2019/0267387 A1  Aug. 29, 2019

(51) Int. Cl.
| | |
|---|---|
| *H01L 27/11* | (2006.01) |
| *G11C 8/14* | (2006.01) |
| *H01L 23/522* | (2006.01) |
| *H01L 21/768* | (2006.01) |
| *H01L 27/105* | (2006.01) |
| *H01L 21/48* | (2006.01) |
| *H01L 23/50* | (2006.01) |

(52) U.S. Cl.
CPC ............ *H01L 27/1104* (2013.01); *G11C 8/14* (2013.01); *H01L 21/486* (2013.01); *H01L 21/76838* (2013.01); *H01L 23/50* (2013.01); *H01L 23/5226* (2013.01); *H01L 27/1052* (2013.01)

(58) Field of Classification Search
CPC ... G11C 8/14; H01L 27/1104; H01L 27/1052; H01L 21/486; H01L 21/76838; H01L 23/50; H01L 23/5226

USPC ........................................................ 365/174
See application file for complete search history.

(56) References Cited

U.S. PATENT DOCUMENTS

| | | | |
|---|---|---|---|
| 8,754,481 B2 * | 6/2014 | Masuoka | H01L 27/088 257/368 |
| 9,472,558 B1 | 10/2016 | Cheng et al. | |
| 9,871,103 B2 | 1/2018 | Kim et al. | |
| 2004/0061153 A1 | 4/2004 | Misewich et al. | |
| 2004/0113207 A1 | 6/2004 | Hsu et al. | |

(Continued)

OTHER PUBLICATIONS

Office Action from related U.S. Appl. No. 15/804,556 dated Apr. 16, 2019.

(Continued)

*Primary Examiner* — Sung Il Cho
(74) *Attorney, Agent, or Firm* — Amerson Law Firm, PLLC

(57) ABSTRACT

A memory cell includes vertical transistors including first and second pass gate (PG) transistors, first and second pull-up (PU1 and PU2) transistors, and first and second pull-down (PD1 and PD2) transistors. A first bottom electrode connects bottom source/drain (SD) regions of PU1 and PU2. A second bottom electrode connects bottom SD regions of PD1 and PD2. A first shared contact connects the top SD region of PU2 to the gate structure of PU1. A second shared contact connects the top SD region of PD1 to the gate structure of PD2. A first top electrode is connected to the top SD regions of PG1, PU1 and the second shared contact to define a first storage node of the memory cell. A second top electrode is connected to the top SD regions of PG2, PU2 and the first shared contact to define a second storage node of the memory cell.

20 Claims, 14 Drawing Sheets

(56) References Cited

U.S. PATENT DOCUMENTS

| | | |
|---|---|---|
| 2005/0186760 A1 | 8/2005 | Hashimura et al. |
| 2006/0017119 A1 | 1/2006 | Jin et al. |
| 2007/0075359 A1 | 4/2007 | Yoon et al. |
| 2008/0179693 A1 | 7/2008 | Kim et al. |
| 2008/0203493 A1 | 8/2008 | Yasuda |
| 2010/0203714 A1* | 8/2010 | Masuoka ............... H01L 21/84 438/586 |
| 2010/0237419 A1 | 9/2010 | Yang et al. |
| 2013/0109165 A1* | 5/2013 | Cho ................. H01L 29/66666 438/589 |
| 2014/0003133 A1 | 1/2014 | Lin et al. |
| 2015/0318288 A1* | 11/2015 | Lim ................... H01L 27/1104 257/329 |
| 2016/0133633 A1 | 5/2016 | Liaw |
| 2017/0287905 A1 | 10/2017 | Morrow et al. |
| 2018/0286957 A1* | 10/2018 | Bae ..................... H01L 29/0649 |
| 2018/0294256 A1* | 10/2018 | Lee ..................... H01L 27/0207 |

OTHER PUBLICATIONS

Office Action from related U.S. Appl. No. 15/804,556 dated Jul. 18, 2018.

Notice of Allowance from related U.S. Appl. No. 15/813,471 dated Jul. 5, 2018.

Chung et al., "Novel 4F2 DRAM Cell with Vertical Pillar Transistor (VPT)," 2011 IEEE, pp. 211-214.

Huynh-Bao et al., "Toward the 5nm Technology: Layout Optimization and Performance Benchmark for Logic/SRAMs Using Lateral and Vertical GAA FETs".

Huynh-Bal et al., "A Comprehensive Benchmark and Optimization of 5-nm Lateral and Vertical GAA 6T-SRAMs," IEEE Transactions on Electron Devices, 63:643-51, Feb. 2016.

Sharma et al., "SRAM Design for Wireless Sensor Networks, Chapter 2 SRAM Bit Cell Optimization," Springer, 2013.

* cited by examiner

VERTICAL TRANSISTOR STATIC RANDOM ACCESS MEMORY CELL

BACKGROUND OF THE INVENTION

1. Field of the Invention

The present disclosure generally relates to the fabrication of semiconductor devices, and, more particularly, to a vertical static random access memory cell and various methods of forming same.

2. Description of the Related Art

Semiconductor memory devices are in widespread use in many modern integrated circuit devices and in many consumer products. In general, memory devices are the means by which electrical information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

In general, efforts have been made to reduce the physical size of such memory devices, particularly reducing the physical size of components of the memory devices, such as transistors, to increase the density of memory devices, thereby increasing performance and decreasing the costs of the integrated circuits incorporating such memory devices. Increases in the density of the memory devices may be accomplished by forming smaller structures within the memory device and by reducing the separation between the memory devices and/or between the structures that make up the memory device. Often, these smaller design rules are accompanied by layout, design and architectural modifications which are either made possible by the reduced sizes of the memory device or its components, or such modifications are necessary to maintain performance when such smaller design rules are implemented. As an example, the reduced operating voltages used in many modern-day conventional integrated circuits are made possible by improvements in design, such as reduced gate insulation thicknesses in the component transistors and improved tolerance controls in lithographic processing. On the other hand, reduced design rules make reduced operating voltages essential to limit the effects of hot carriers generated in small size devices operating at higher, previously conventional operating voltages.

Making SRAMs in accordance with smaller design rules, as well as using reduced internal operating voltages, can reduce the stability of SRAM cells. Reduced operating voltages and other design changes can reduce the voltage margins which ensure that an SRAM cell remains in a stable data state during a data read operation, increasing the likelihood that the read operation could render indeterminate or lose entirely the data stored in the SRAM cell. As shown in FIG. 1, a typical 6T (six transistor) SRAM memory cell 100 includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (104A, 104B, respectively) connected to the gate (106A, 106B, respectively) of a corresponding NMOS pull-down transistor PD1, PD2. The PMOS pull-up transistors PU1, PU2 have their drain regions connected to the drain regions of corresponding NMOS pull-down transistors PD1, PD2 to form inverters having a conventional configuration. The source regions of the PMOS pull-up transistors PU1, PU2 are connected to a high reference potential, typically VDD, and the source regions of the NMOS pull-down transistors PD1, PD2 are connected to a lower reference potential, typically VSS or ground. The gates of the PMOS pull-up transistor PU1 and the NMOS pull-down transistor PD1, which make up one inverter, are connected to the drain regions of the transistors PU2, PD2 of the other inverter. Similarly, the gates of the PMOS pull-up transistor PU2 and the NMOS pull-down transistor PD2, which make up the other inverter, are connected to the drain regions of the transistors PU1, PD1. Hence, the potential present on the drain regions of the transistors PU1, PD1 (node N1) of the first inverter is applied to the gates of the transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 100 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 100 can be quantified by the margin by which the potential on the charge storage nodes can vary from its nominal value while still keeping the SRAM 100 cell in its original state.

Data is read out of the conventional SRAM cell 100 in a non-destructive manner by selectively coupling each charge storage node (N1, N2) to a corresponding one of a pair of complementary bit lines (BLB, BL). The selective coupling is accomplished by the aforementioned pass gate transistors PG1, PG2, where each pass gate transistor is connected between one of the charge storage nodes (N1, N2) and one of the complementary bit lines (BLN, BL). Word line signals are provided to the gates of the pass gate transistors PG1, PG2 to switch the pass gate transistors ON during data read operations. Charge flows through the ON pass gate transistors to or from the charge storage nodes (N1, N2), discharging one of the bit lines and charging the other of the bit lines. The voltage changes on the bit lines are sensed by a differential amplifier (not shown).

Prior to a read operation, the bit lines BLB, BL are typically equalized at a voltage midway between the high and low reference voltages, typically ½ (VDD-VSS), and then a signal on the word line WL turns the pass gate transistors PG1, PG2 ON. As an example, consider that N1 is charged to a predetermined potential of VDD and N2 is charged to a lower potential VSS. When the pass gate transistors PG1, PG2 turn ON, charge begins flowing from node N1 through pass gate transistor PG1 to bit line BL. The charge on node N1 begins to drain off to the bit line BLB and is replenished by charge flowing through pull-up transistor PU1 to node N1. At the same time, charge flows from bit line BL through pass gate transistor PG2 to node N2 and the charge flows from the node N2 through the pull-down transistor PD2. To the extent that more current flows through pass gate transistor PG1 than flows through pull-up transistor PU1, charge begins to drain from the node N1, which, on diminishing to a certain level, can begin turning OFF pull-down transistor PD2. To the extent that more current flows through pass transistor PG2 than flows through pull-down transistor PD2, charge begins to accumulate on charge storage node N2, which, on charging to a certain level, can begin turning OFF pull-up transistor PU1.

For the SRAM cell's latch to remain stable during such a data reading operation, at least one of the charge storage nodes (N1, N2) within the SRAM cell 100 must charge or discharge at a faster rate than charge flows from or to the corresponding bit line. In the past, one technique used to achieve this control is to configure the various transistors of the SRAM cell 100 such that the pass gate transistors PG1, PG2 are strong enough to over-write the pull-up transistors PU1, PU2 during a write operation, but weak enough so as to not over-write the pull-down transistors PD1, PD2 during a read operation.

For highly scaled memory cells, this difference in the gate widths of the various transistors may not provide enough confidence that the SRAM cell 100 will remain stable during operation. Another technique that has been employed, in addition to the difference in gate widths, is to provide an additional well implant (P-type dopant) for the pass gate transistors PG1, PG2 in an attempt to further insure that the threshold voltage (Vt) of the pass gate transistors PG1, PG2 is sufficiently high so as not to flip the bit cell during a read operation. This technique is referred to as providing a voltage threshold mismatch (Vtmm).

As SRAM devices continue to scale down, such as below 10 nm, the transistors are susceptible to short channel effects due to the corresponding scaling of the gate electrodes. These effects degrade Vtmm as well as memory cell stability.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a vertical static random access memory cell and the resulting device. An illustrative memory cell disclosed herein includes a plurality of vertical transistors including first and second pass gate transistors, first and second pull-up transistors, and first and second pull-down transistors. Each of the plurality of vertical transistors includes a pillar of semiconductor material, a first source/drain region on a lower portion of the pillar, a gate structure disposed around the pillar above the first source/drain region, and a second source/drain region on a top portion of the pillar above the gate electrode. A first bottom electrode connects the source/drain regions of first and second pull-up transistors. A second bottom electrode connects the source/drain regions of the first and second pull-down transistors. A first shared contact connects the top source/drain region of the second pull-up transistor to the gate structure of the first pull-up transistor. A second shared contact connects the top source/drain region of the first pull-down transistor to the gate structure of the second pull-down transistor. A first top electrode is connected to the top source/drain regions of the first pass gate transistor, the first pull-up transistor, and the second shared contact to define a first storage node of the memory cell. A second top electrode is connected to the top source/drain regions of the second pass gate transistor, the second pull-down transistor, and the first shared contact to define a second storage node of the memory cell.

Another illustrative memory cell disclosed herein includes, among other things, a plurality of vertical transistors including first and second pass gate transistors, first and second pull-up transistors, and first and second pull-down transistors. Each of the plurality of vertical transistors includes a pillar of semiconductor material, a first source/drain region on a lower portion of the pillar, a gate structure disposed around the pillar above the first source/drain region, and a second source/drain region on a top portion of the pillar above the gate electrode. A first bottom electrode connects the source/drain regions of the first and second pull-up transistors. A second bottom electrode connects the source/drain regions of the first and second pull-down transistors. A first routing gate connects the gate structures of the first pull-up transistor and the first pull-down transistor. A second routing gate connects the gate structures of the second pull-up transistor and the second pull-down transistor. A third routing gate is connected to the gate structure of the second pull-up transistor. A fourth routing gate is connected to the gate structure of the first pull-up transistor. A first shared contact connects the top source/drain region of the second pull-up transistor and the third routing gate. A second shared contact connects the top source/drain region of the first pull-down transistor to the fourth routing gate. A first top electrode is connected to the top source/drain regions of the first pass gate transistor and the first pull-up transistor, and to the second shared contact to define a first storage node of the memory cell. A second top electrode is connected to the top source/drain regions of the second pass gate transistor and the second pull-down transistor, and to the first shared contact to define a second storage node of the memory cell.

An illustrative method disclosed herein includes, among other things, forming a plurality of vertical transistors including first and second pass gate transistors, first and second pull-up transistors, and first and second pull-down transistors. Each of the plurality of vertical transistors includes a pillar of semiconductor material, a first source/drain region on a lower portion of the pillar, a gate structure disposed around the pillar above the first source/drain region, and a second source/drain region on a top portion of the pillar above the gate electrode. A first bottom electrode is formed to connect the source/drain regions of the first and second pull-up transistors. A second bottom electrode is formed to connect the source/drain regions of the first and second pull-down transistors. A dielectric layer is formed between the plurality of vertical transistors. A first shared contact is formed embedded in the dielectric layer to connect the top source/drain region of the second pull-up transistor to the gate structure of the first pull-up transistor. A second shared contact is formed embedded in the dielectric layer to connect the top source/drain region of the first pull-down transistor to the gate structure of the second pull-down transistor. A first top electrode is formed embedded in the dielectric layer to connect to the top source/drain regions of the first pass gate transistor, the first pull-up transistor, and the second shared contact to define a first storage node of the memory cell. A second top electrode is formed embedded in the dielectric layer to connect to the top source/drain regions of the second pass gate transistor, the second pull-down transistor, and the first shared contact to define a second storage node of the memory cell.

BRIEF DESCRIPTION OF THE DRAWINGS

The disclosure may be understood by reference to the following description taken in conjunction with the accompanying drawings, in which like reference numerals identify like elements, and in which.

Figure 1:
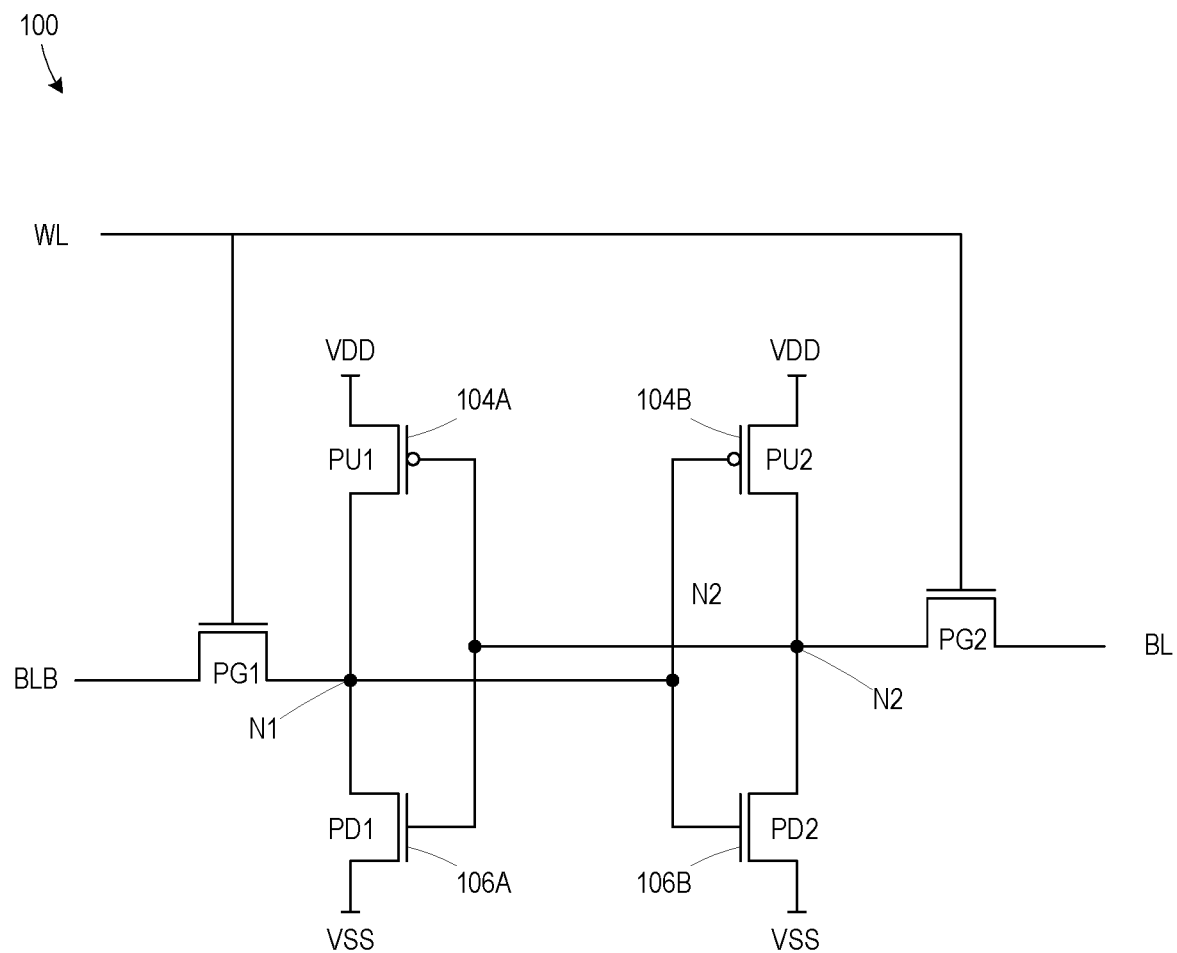
FIG. 1 schematically depicts an illustrative prior art SRAM memory device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a vertical static random access memory cell and the resulting device. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
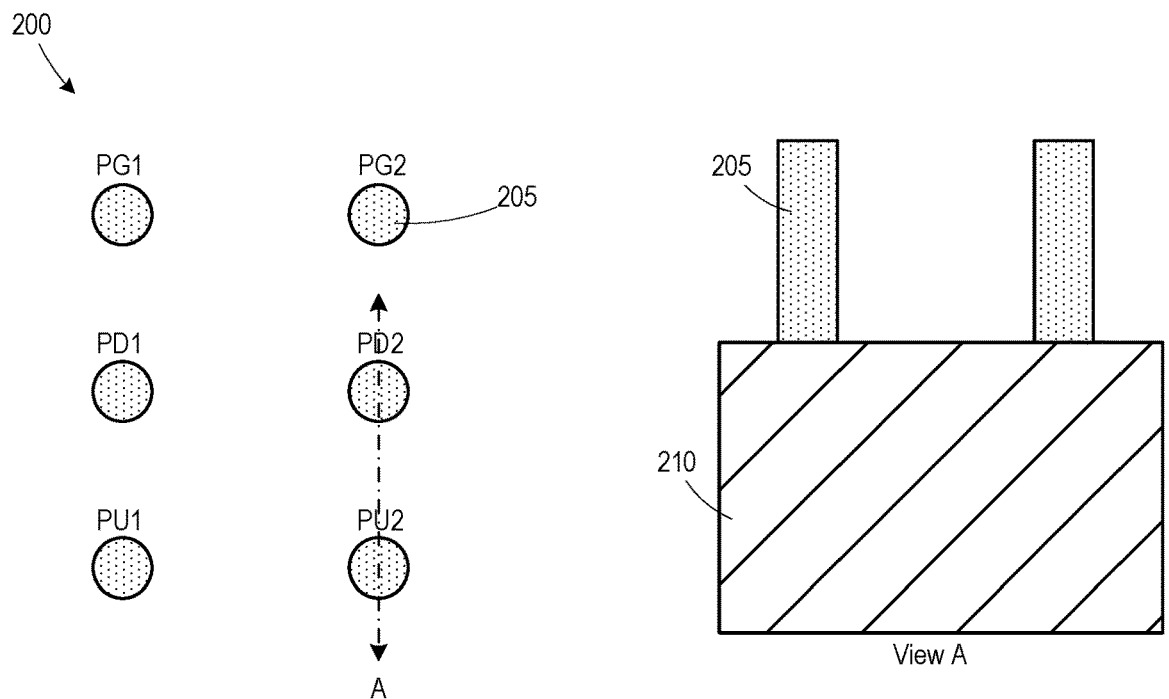
FIGS. 2A-2R depict various methods disclosed herein of forming a vertical SRAM cell.
Figure 2B:
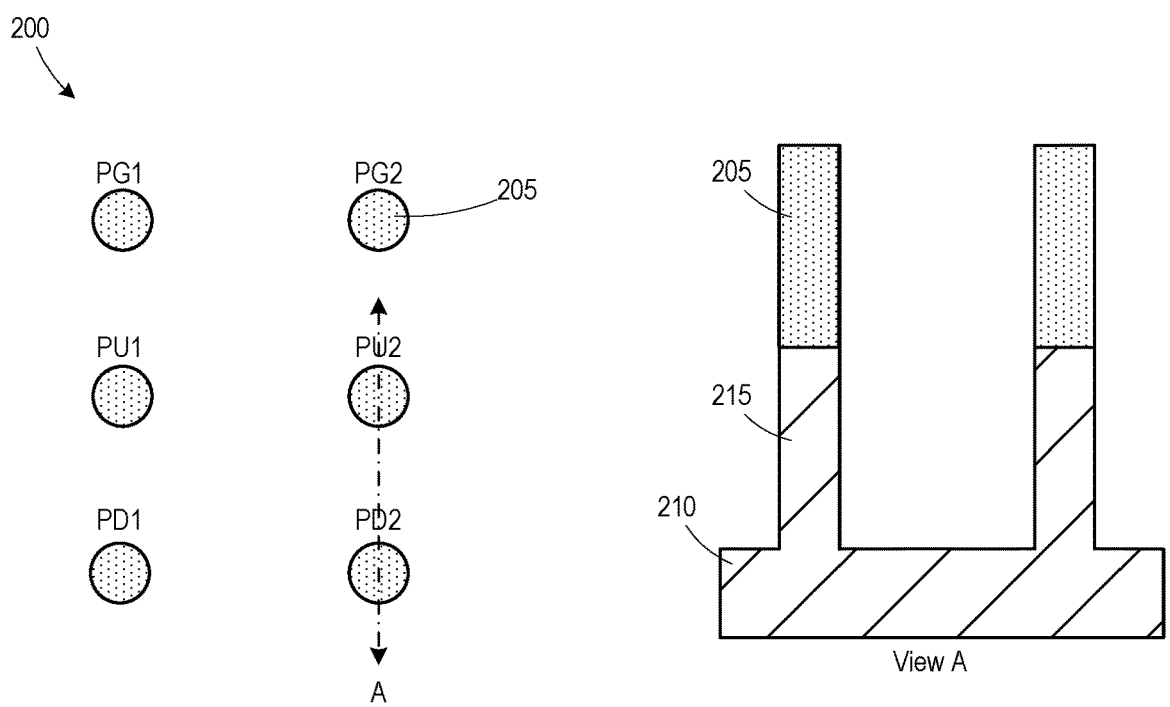
Figure 2C:
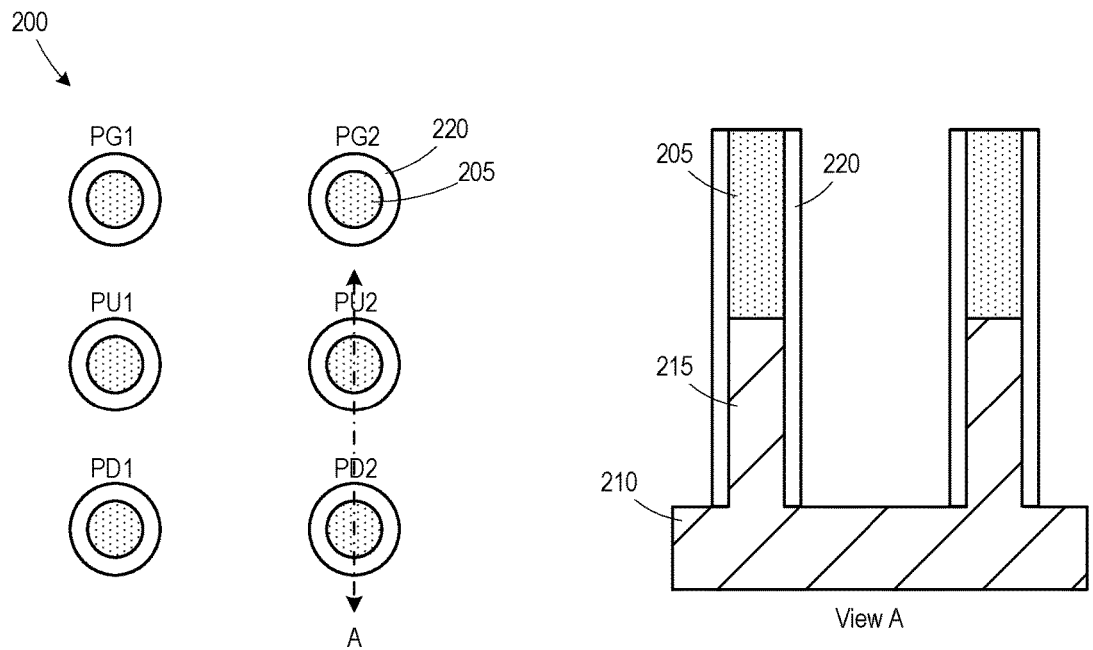
Figure 2D:
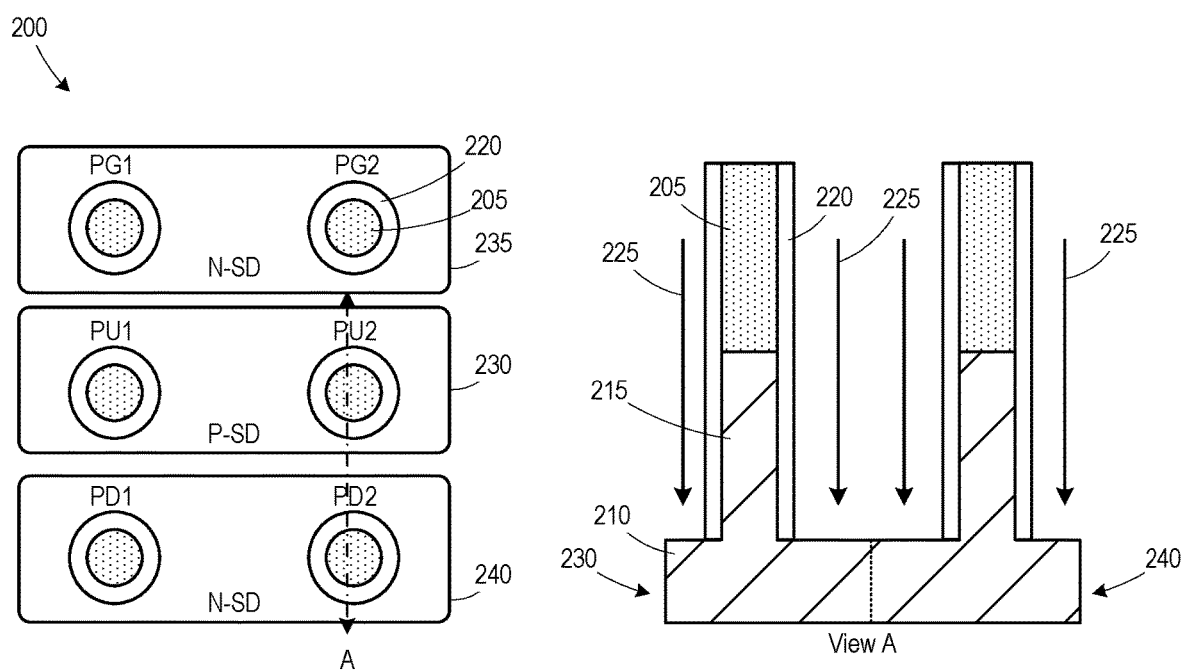
Figure 2E:
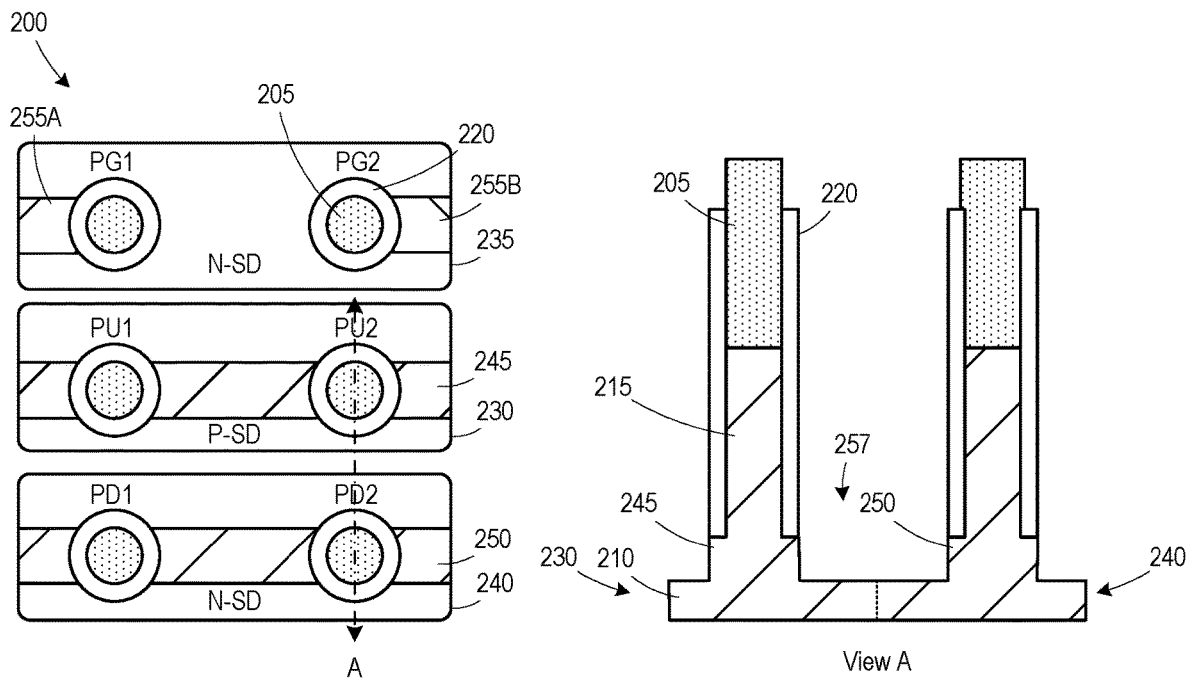
Figure 2F:
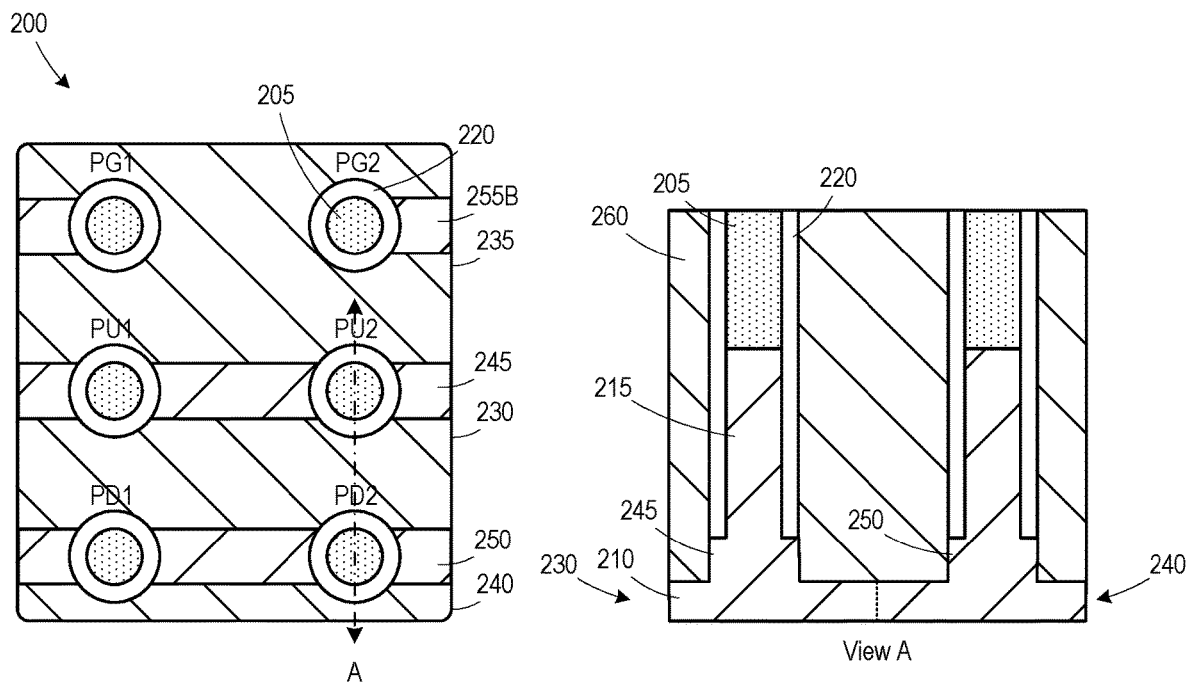
Figure 2G:
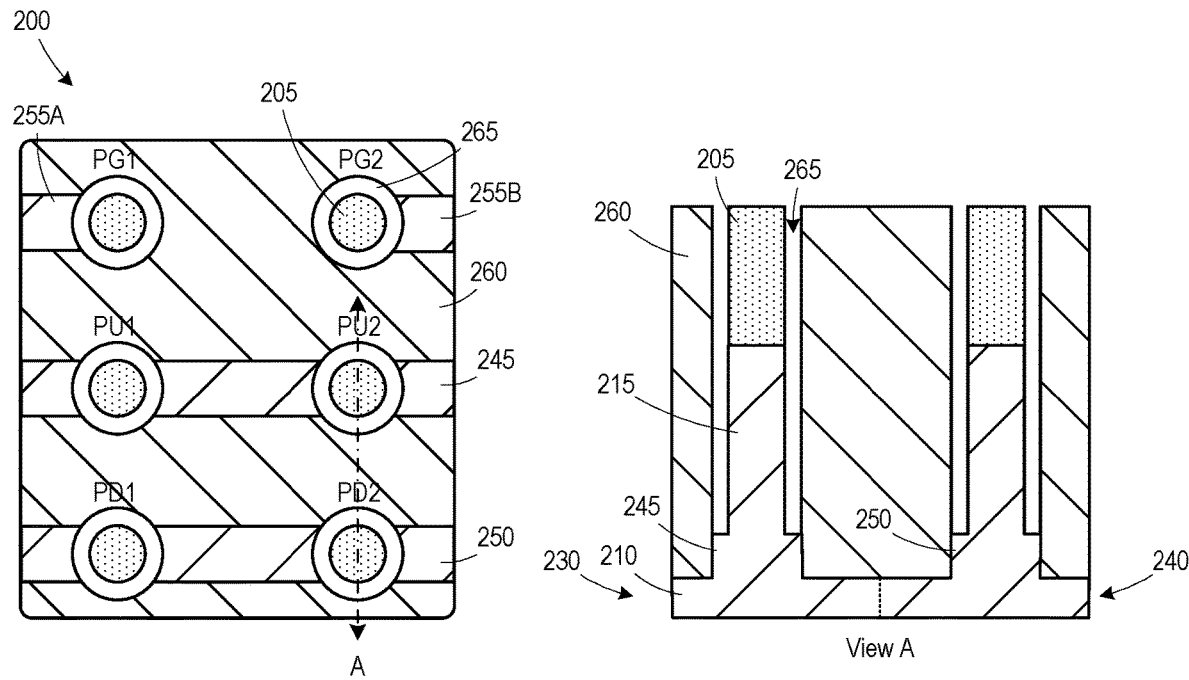
Figure 2H:
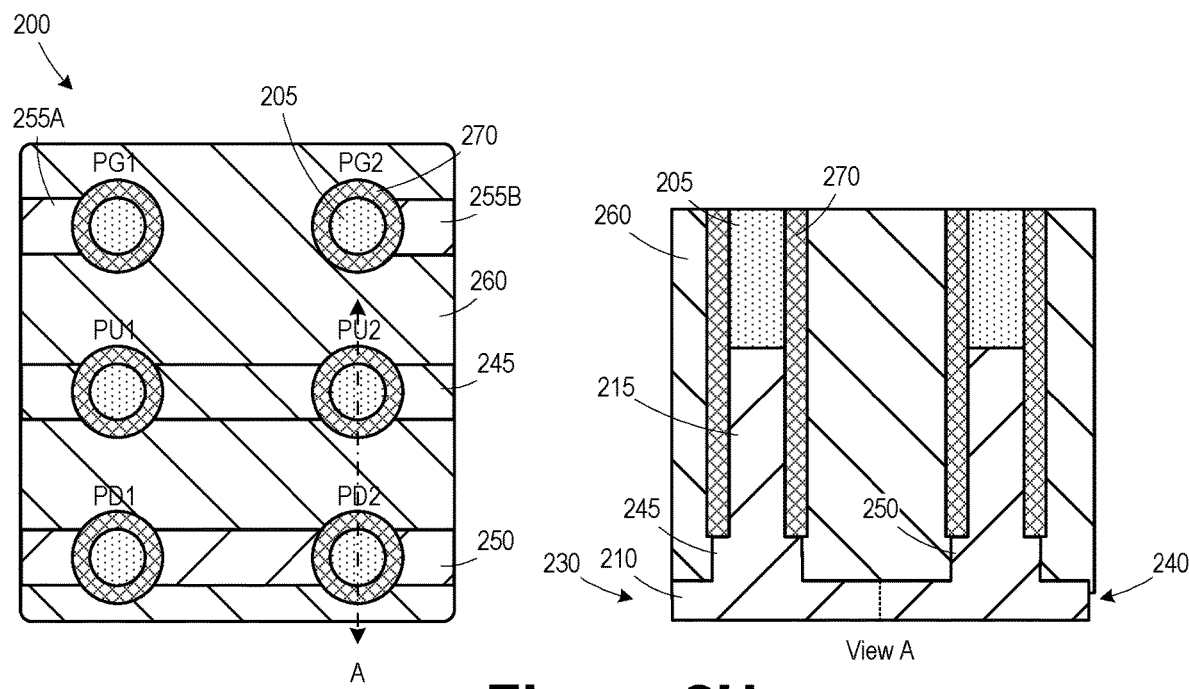
Figure 2I:
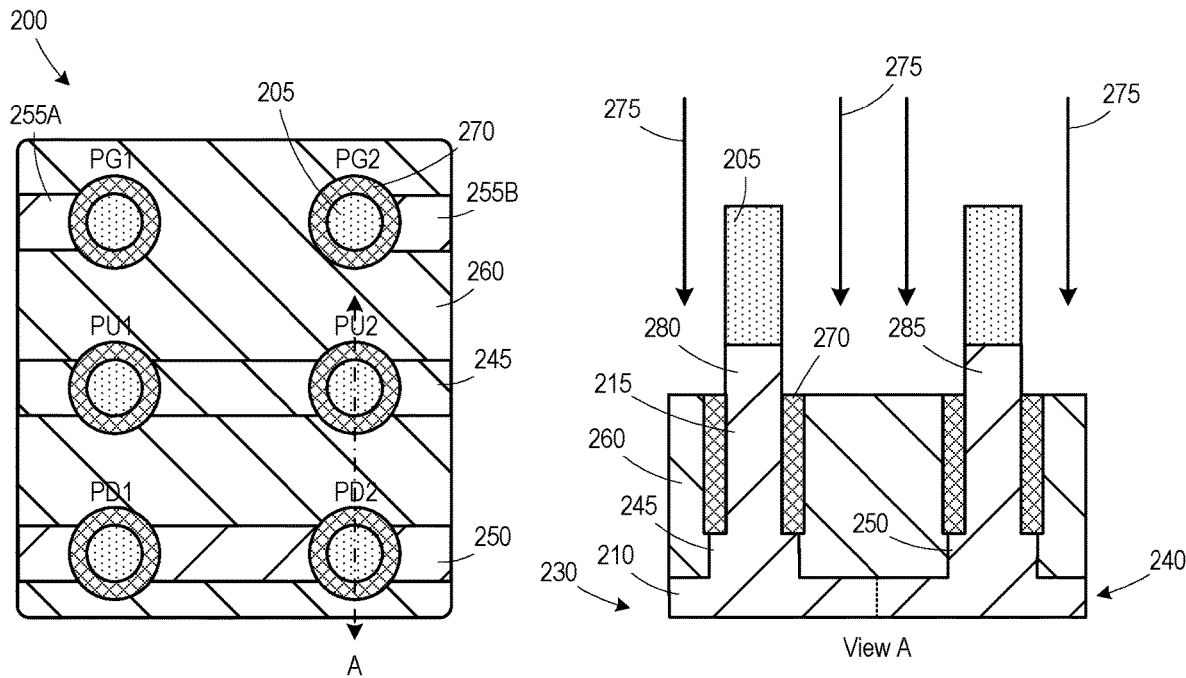
Figure 2J:
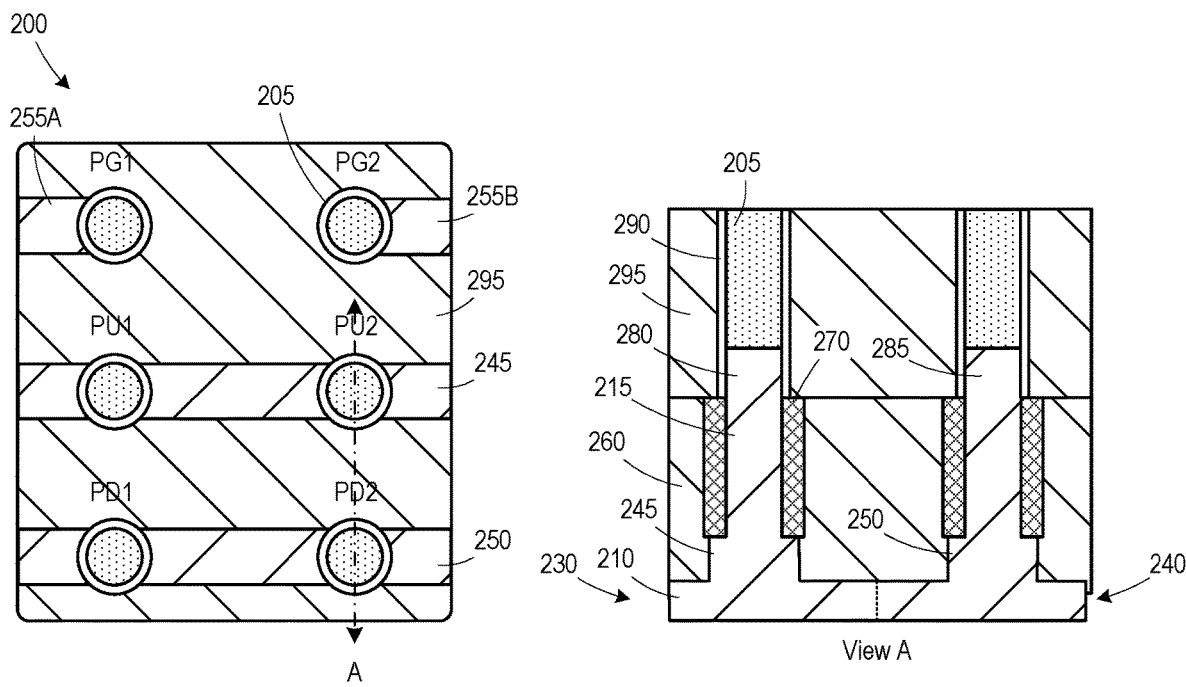
Figure 2K:
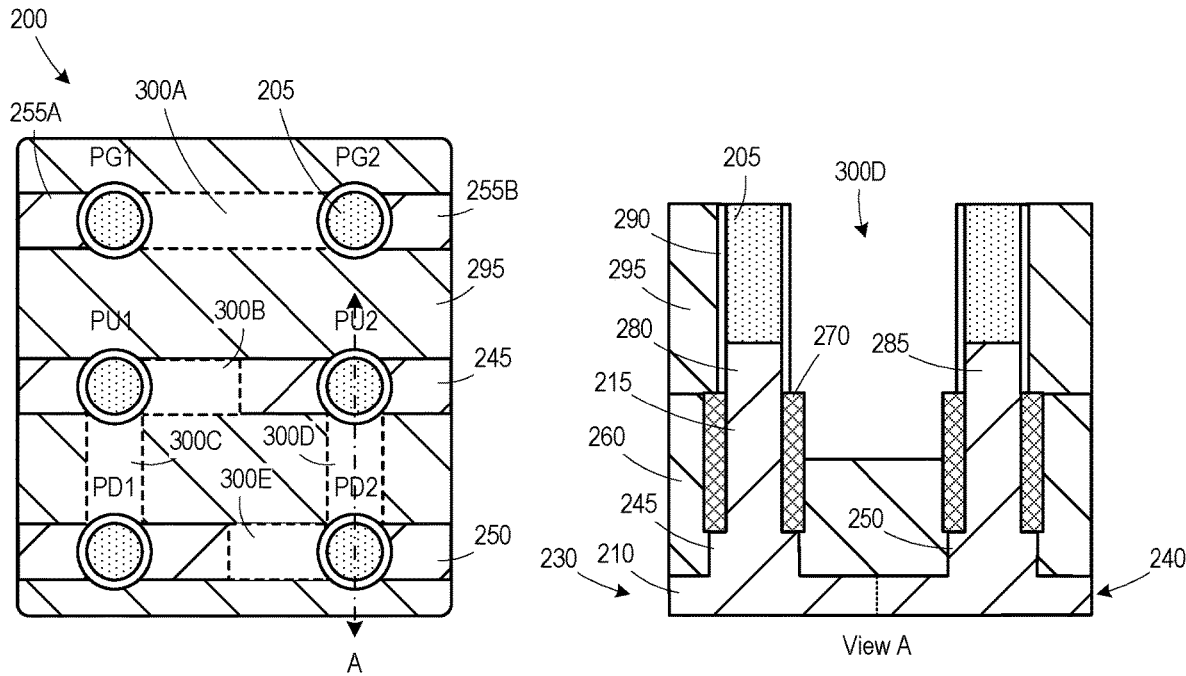
Figure 2L:
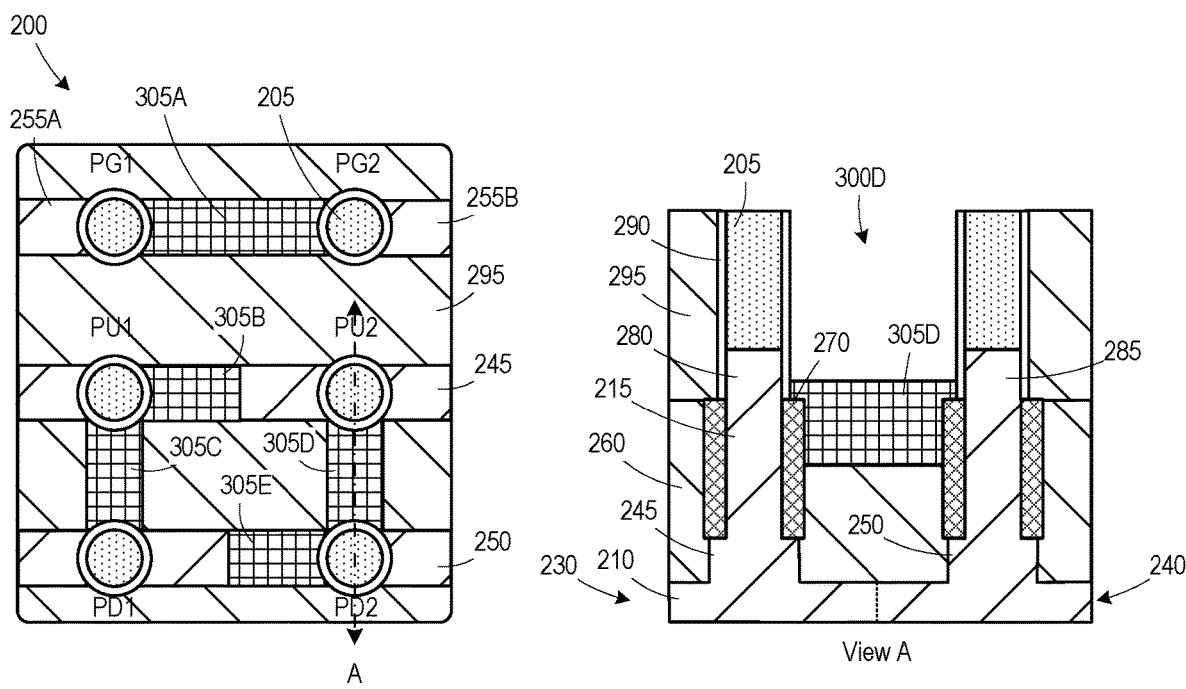
Figure 2M:
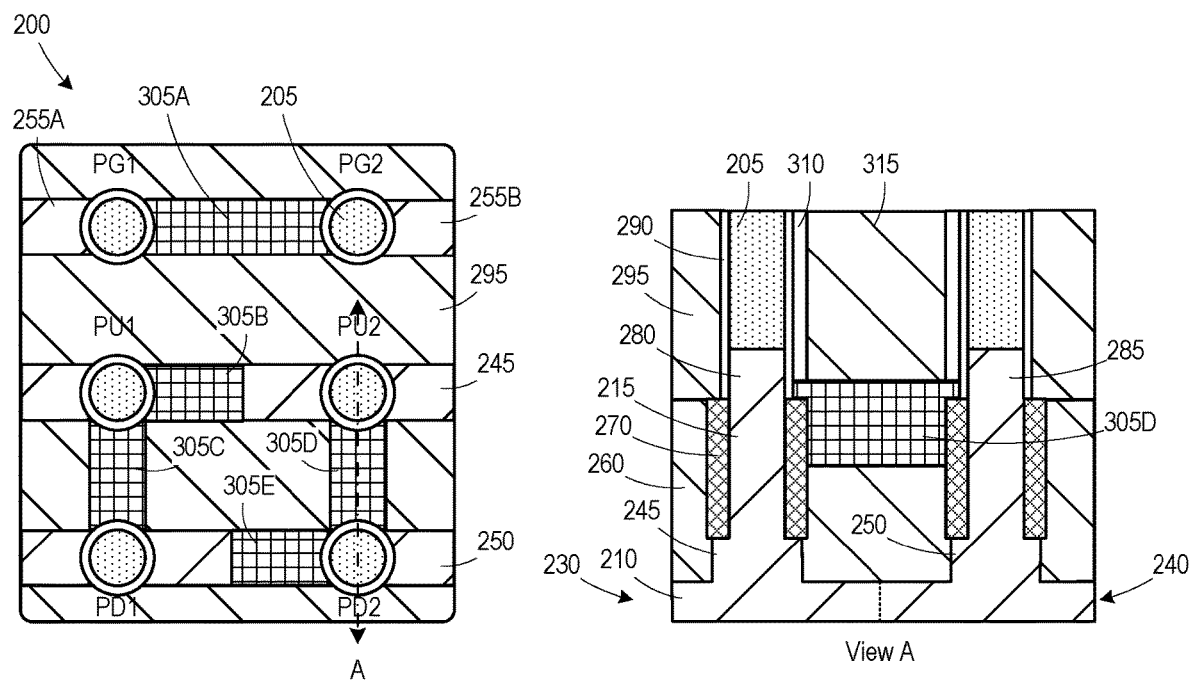
Figure 2N:
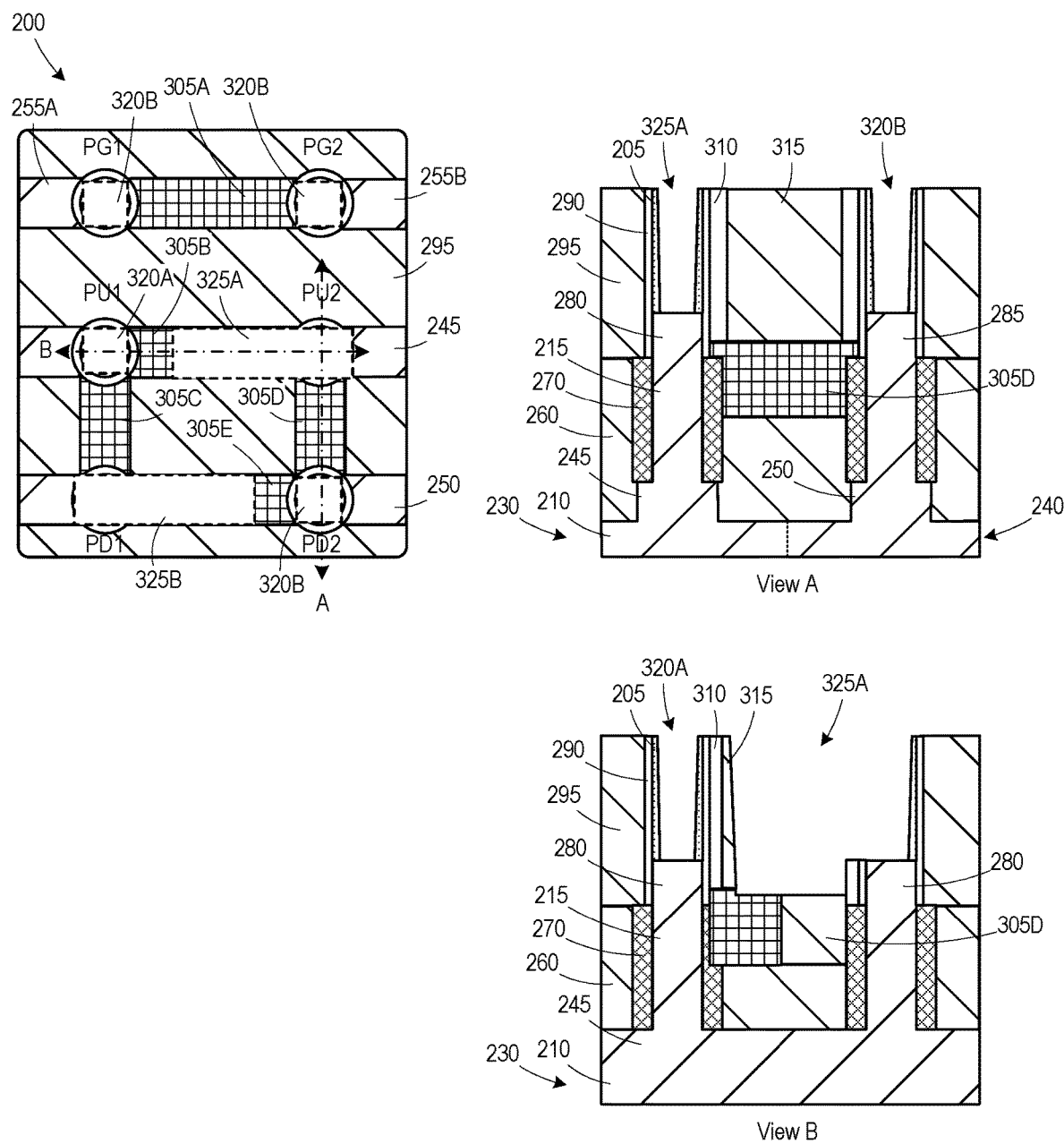
Figure 2O:
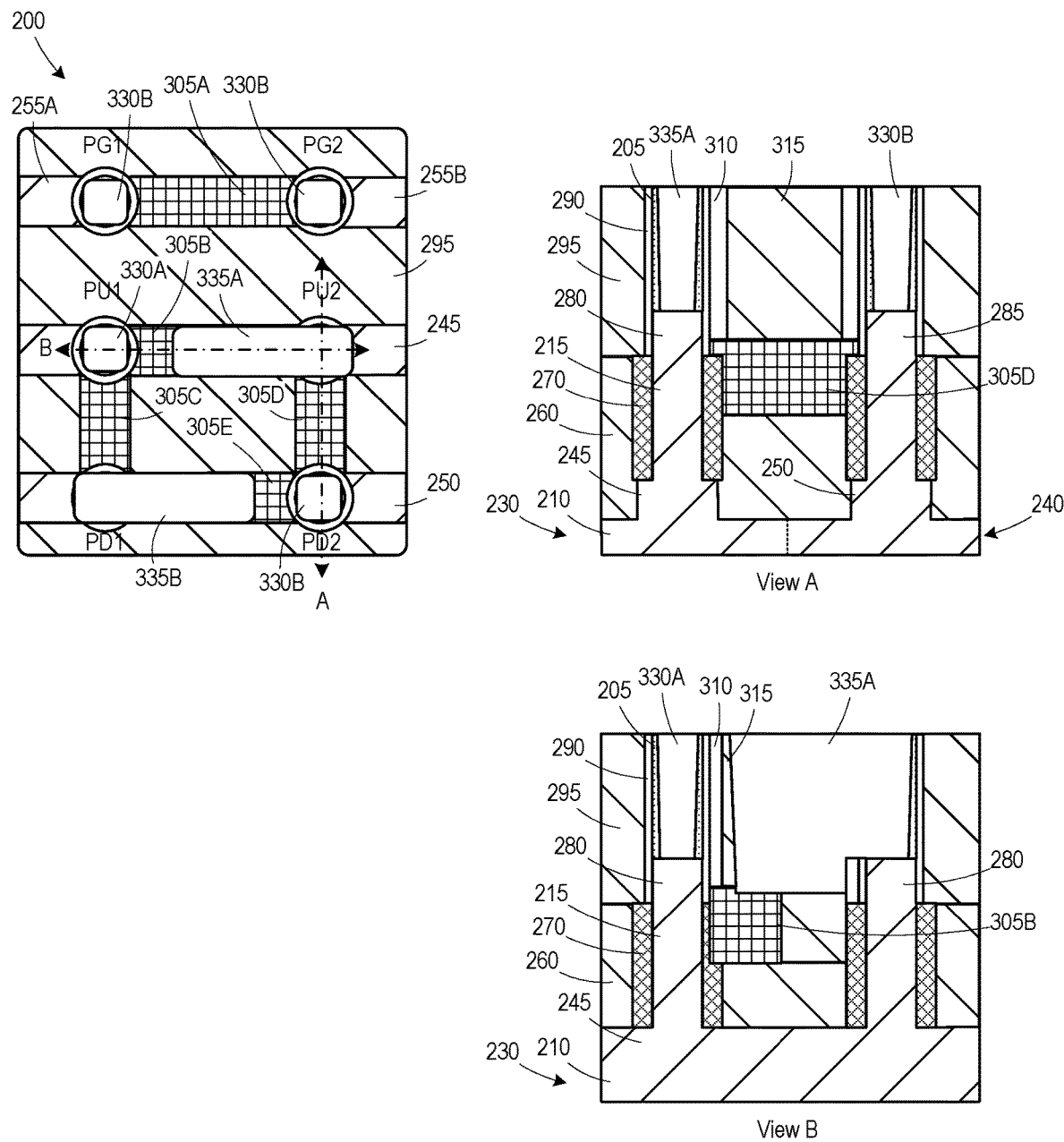
Figure 2P:
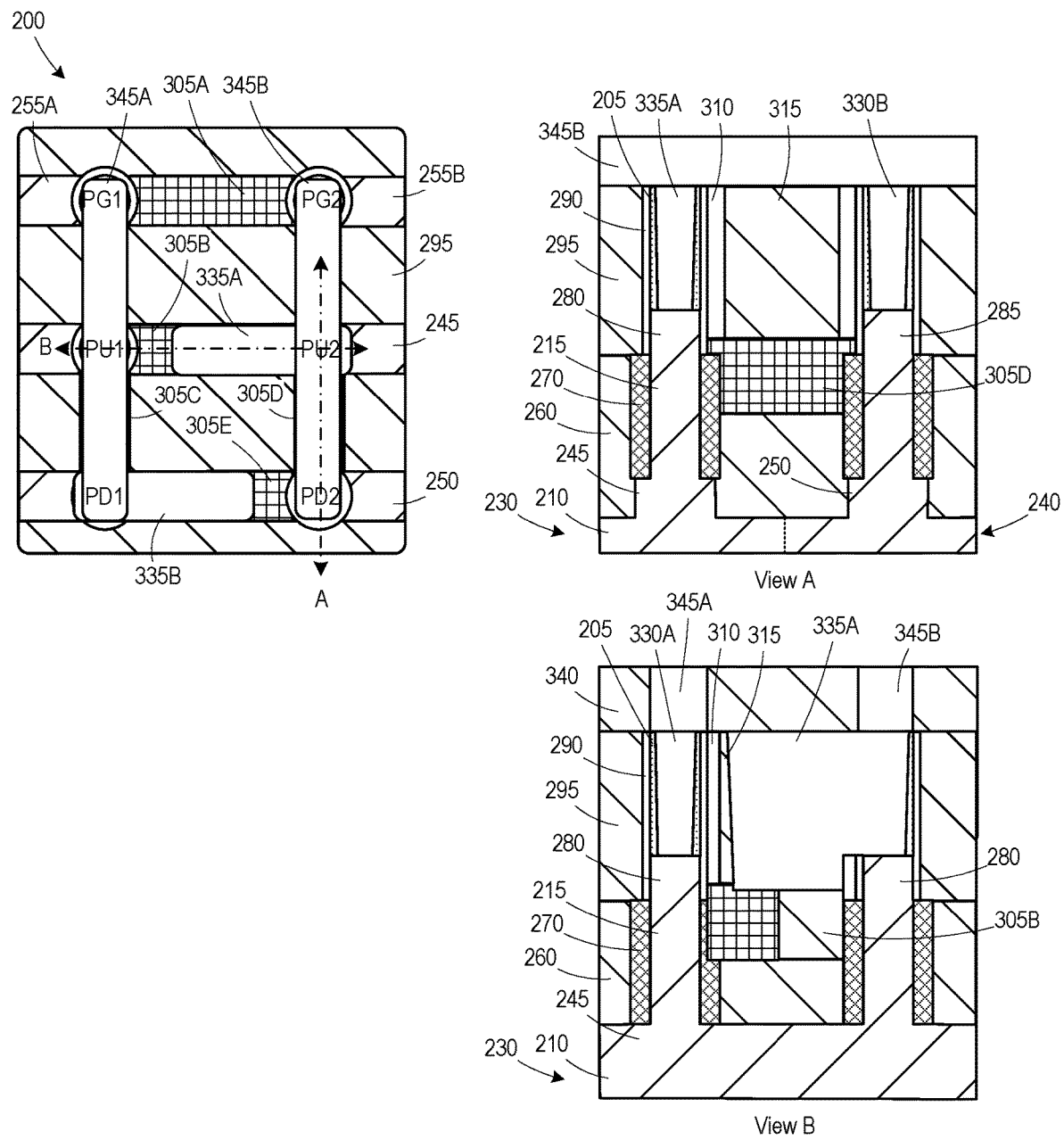
Figure 2Q:
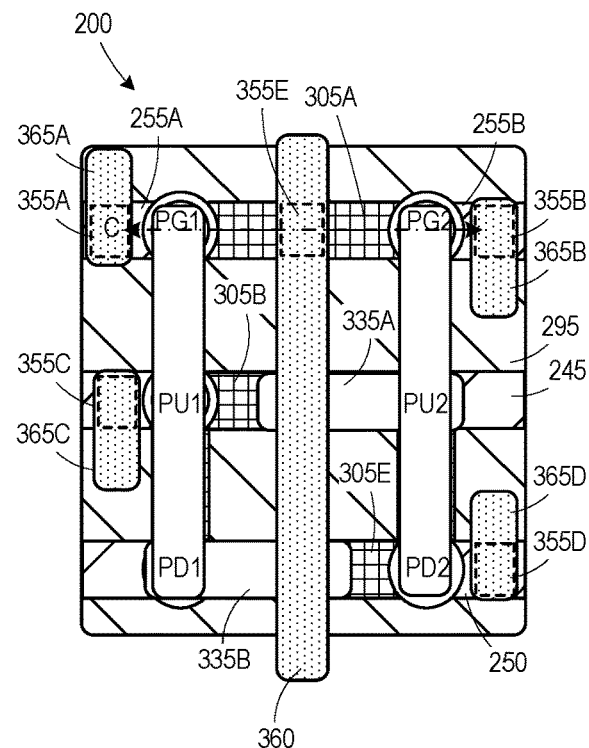
Figure 2Q:
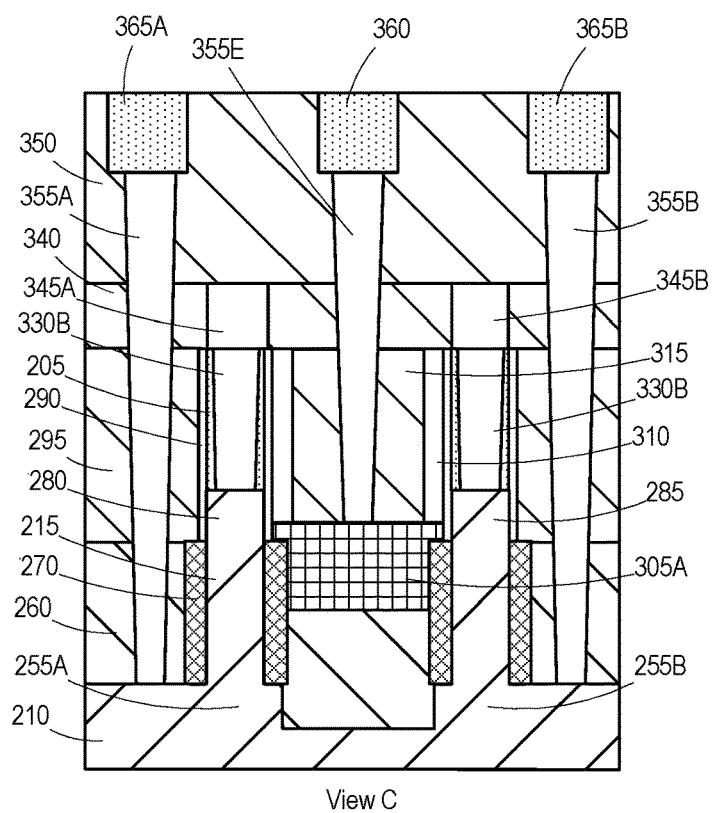
Figure 2R:
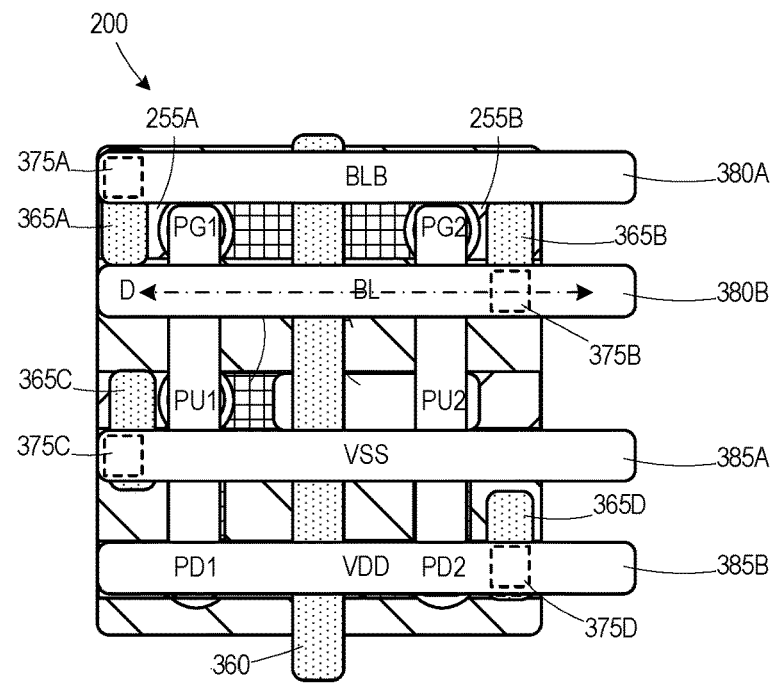
Figure 2R:
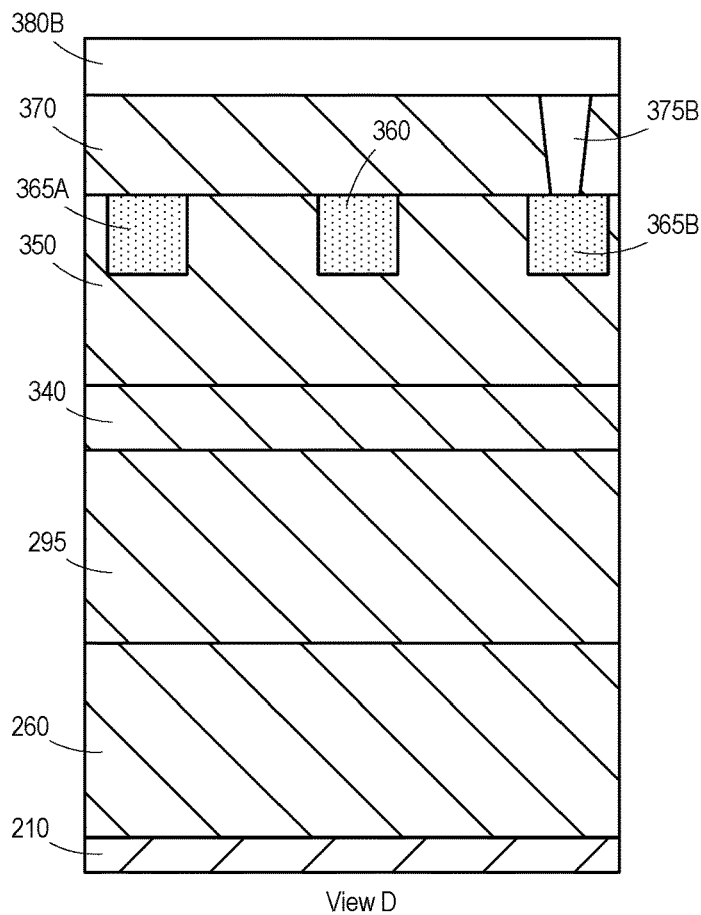

FIGS. 2A-2R illustrate various methods for forming a vertical six transistor (6T) static random access memory (SRAM) cell 200, including pass gate transistors PG1, PG2, pull-up transistors PU1, PU2, and pull-down transistors PD1, PD2. The particular arrangement of the transistors may vary. FIGS. 2A-2R show a top view and a cross-sectional view of the memory cell 200 in the process of being fabricated. FIG. 2A depicts the (SRAM) cell 200 with a hard mask layer 205 (e.g., SiN) formed and patterned above a silicon substrate 210. For ease of illustration, the horizontal surface of the substrate 210 is not shown in the top view. The hard mask layer 205 may be formed by depositing a layer of hard mask material, forming a photoresist layer above the hard mask material, patterning the photoresist layer and etching the hard mask material in the presence of the photoresist material, as is known to those of ordinary skill in the art.

FIG. 2B depicts the SRAM cell 200 after an etch process, such as an anisotropic etch process, was performed to remove material from the silicon substrate 210 to define silicon pillars 215. Although the pillars 215 are illustrated as having circular cross-sections, other cross-sectional shapes, such as ovals, squares, rectangles, etc., may be employed.

FIG. 2C depicts the SRAM cell 200 after sacrificial spacers 220 (e.g., a gate insulation layer (e.g., silicon dioxide) covered by a gate electrode layer (e.g., amorphous silicon)—not separately shown) were formed on sidewalls of the hard mask layers 205 and the pillars 215. The sacrificial spacers 220 serve as dummy gate electrodes that will be later replaced with other materials. In some embodiments, multiple layers may not be used.

FIG. 2D depicts the SRAM cell 200 after a plurality of implantation processes 225 was performed to form P-type source/drain regions 230 for the PU1/PU2 transistors, and N-type source/drain regions 235, 240 for the PG1/PG2 transistors and the PD1/PD2 transistors, respectively. Separate implantation steps with different dopant types may be performed in the presence of implantation masks (not shown) to define the P-type source/drain region 235 (e.g., B, $BF_2$) and the N-type source/drain regions 235, 240 (e.g., As, P). In some embodiments, the implantations may include enhancement implantations, such as LDD and halo implantations. The implantations may be performed using various tilt angles.

FIG. 2E depicts the SRAM cell 200 after an etching step was performed to extend the pillars 215 to define bottom electrodes 245, 250, 255A, 255B and to define isolation trenches 257. The bottom electrode 245 serves as a VDD electrode, the bottom electrode 250 serves as a VSS electrode, and the bottom electrodes 255A, 255B serve to connect the PG transistors to those of neighboring cells.

FIG. 2F depicts the SRAM cell 200 after several processes were performed to deposit a dielectric layer 260 (e.g., silicon dioxide, low-k dielectric, ultra low-k dielectric, etc.) above the pillars 215 and a planarization process was performed to expose the hard mask layer 205.

FIG. 2G depicts the SRAM cell 200 after one or more etch processes were performed to remove the sacrificial spacers 220 (e.g., etch processes for removing the dummy gate electrode layer and the dummy gate insulation layer) to define gate cavities 265.

FIG. 2H depicts the SRAM cell 200 after several processes were performed to form gate structures 270 in the gate cavities 265. The gate structures 270 may include a gate insulation layer (e.g., $HfO_2$, $SiO_2$, a different high-k dielectric, etc.) and a gate electrode material layer (e.g., metal, work function material, etc.). One or more barrier layers may also be used (not shown). For ease of illustration, the individual layers of the gate structures 270 are not illustrated.

FIG. 2I depicts the SRAM cell 200 after several processes were performed. One or more etch processes were performed to recess the dielectric layer 260 and the gate structures 270, thereby exposing an upper portion of the pillars 215. One or more implantation processes 275 were performed to form P-type top source/drain regions 280 for the PU1/PU2 transistors, and N-type top source/drain regions 285 for the PG1/PG2 transistors and the PD1/PD2 transistors, respectively. Separate implantation steps with different dopant types may be performed in the presence of implantation masks (not shown) to define the P-type top source/drain regions 280 (e.g., B, $BF_2$) and the N-type top source/drain regions 285 (e.g., As, P). In some embodiments, the implantations may include enhancement implantations, such as LDD and halo implantations. The implantations may be performed using various tilt angles. An anneal was performed to activate the implanted dopants in the top and bottom SD regions 230. 235, 240, 280, 285.

FIG. 2J depicts the SRAM cell 200 after several processes were performed. A deposition process and an etch process were performed to form upper spacers 290 (e.g., silicon nitride). Another deposition process was performed to form a dielectric layer 295 (e.g., silicon dioxide, low-k dielectric, ultra low-k dielectric, etc.), and a planarization process was performed to expose the hard mask layer 205.

FIG. 2K depicts the SRAM cell 200 after a patterned etch process was performed to define routing gate recesses 300A, 300B, 300C, 300D, 300E in the dielectric layers 260, 295.

FIG. 2L depicts the SRAM cell 200 after a plurality of processes were performed to define routing gates 305A (gates of PG1/PG2), 305B (gate of PU1), 305C (gates of PU1 and PD1)), 305D (gates of PU2/PD2), 305E (gate of PD2) in the routing gate recesses 300A, 300B, 300C, 300D, 300E. A deposition process was performed to deposit a routing gate material (e.g., W, TiN, TaN, $WSi_2$, $TiSi_2$, Al). A planarization process was performed to remove portions of the routing gate material extending above the dielectric layer 295, and a recess etch process was performed to recess the routing gate material.

FIG. 2M depicts the SRAM cell 200 after several processes were performed. A deposition process and an etch process were performed to form spacers 310 (e.g., silicon nitride). Another deposition process was performed to form a dielectric layer 315 (e.g., silicon dioxide, low-k dielectric, ultra low-k dielectric, etc.), and a planarization process was performed to expose the hard mask layer 205.

FIG. 2N depicts the SRAM cell 200 after a patterned anisotropic etch process was performed to form top source/drain contact openings 320A exposing the top source/drain region 280 of PD1 and top source/drain contact openings 320B exposing the top source/drain regions 285 of PG1, PG2, PD2, and to form a shared contact opening 325A exposing the routing gate 305B and the top source/drain region 280 of PU2 and a shared contact opening 325B exposing the routing gate 305E and the top source/drain region 285 of PD1. FIG. 2N includes View B taken through PU1 and PU2.

FIG. 2O depicts the SRAM cell 200 after the top source/drain contact openings 320A, 320B and the shared contact openings 325A, 325B are filled with a conductive material (e.g., W, TiN, TiSi, PtSi, Co, Ta) to define top source/drain contacts 330A, 330B and shared contacts 335A. 335B. The shared contact 335A connects the gate structure 270 of PU1 to the P-type top source/drain 280 of PU2 via the routing gate 305B. The shared contact 335B connects the gate structure 270 of PD2 to the P-type top source/drain 285 of PD1 via the routing gate 305D.

FIG. 2P depicts the SRAM cell 200 after several processes were performed. A dielectric layer 340 (not visible in View A since View A passes through a trench in the dielectric layer 340) was formed above the top source/drain contacts 330A, 330B and shared contacts 335A, 335B. A patterned etch process was performed to define trenches in the dielectric layer 340, and one or more deposition processes were performed to fill the trenches with a conductive material (e.g., W, TiN, TiSi, PtSi, Co, Ta) to define top electrodes 345A, 345B. The top electrode 345A contacts the left top source/drain contacts 330A, 330B and the shared contact 335B. The top electrode 345B contacts the right top source/drain contacts 330A, 330B and the shared contact 335A. The top electrodes 345A, 345B essentially merge with their respective top source/drain contacts 330A, 330B and shared contacts 335A, 335B. The top electrodes 345A, 345B define the storage nodes N1, N2, respectively.

FIG. 2Q depicts the SRAM cell 200 after several processes were performed. FIG. 2Q includes View C taken through PG1 and PG2. A dielectric layer 350 was formed above the top electrodes 345A, 345B. One or more patterned etch processes were performed to define contact openings and trenches in the dielectric layer 350, and one or more deposition processes were performed to fill the contact openings and trenches with a conductive material (e.g., W, TiN, TiSi, PtSi, Co, Ta) to define vias 355A, 355B, 355C, 355D, 355E, word line 360, and word line electrodes 365A, 365B, 365C, 365D.

The vias 355A, 355B contact the bottom electrodes 255A, 255B, respectively. The via 355C contacts the bottom electrode 245. The via 355D contacts the bottom electrode 250. The via 355E contacts the routing gate 305A that connects the gates of PG1/PG2. The word line 360 contacts the via 355D. The word line electrodes 365A, 365B contact the vias 355A, 355B, respectively. The word line electrode 365C contacts the via 355C. The word line electrode 365D contacts the via 355D.

FIG. 2R depicts the SRAM cell 200 after several processes were performed. FIG. 2R includes View D taken through the word line electrode 365A below PG1 and PG2. A dielectric layer 370 was formed above the dielectric layer 350. One or more patterned etch processes were performed to define contact openings and trenches in the dielectric layer 370, and one or more deposition processes were performed to fill the contact openings and trenches with a conductive material (e.g., W, TiN, TiSi, PtSi, Co, Ta) to define vias 375A, 375B, 375C, 375D, bit lines 380A (BLB), 380B (BL), and supply lines 385A (VSS), 385B (VDD).

The via 375A connects the word line electrode 365A to the BLB bit line 380A. The via 375B connects the word line electrode 365B to the BL bit line 380B. The via 375C connects the word line electrode 365C to the VSS supply line 385A. The via 375D connects the word line electrode 365D to the VDD supply line 385B.

Figure 3:
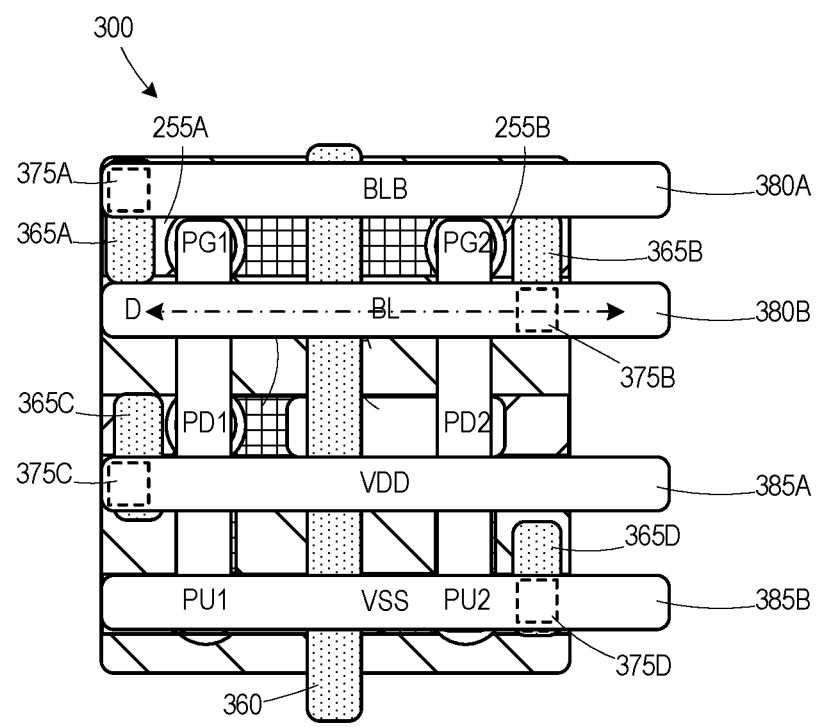
FIG. 3 is a top view of an alternative embodiment of a vertical SRAM cell.

FIG. 3 depicts an SRAM cell 300 with an alternative arrangement of the transistors. The locations of the pull up and pull down transistors are reversed. The previously described dopant implantation steps for the well regions, LDD and SD implantations would vary according to the new arrangement. The VSS and VDD supply lines would also be reversed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A memory cell, comprising:
   a plurality of vertical transistors including first and second pass gate transistors, first and second pull-up transistors, and first and second pull-down transistors, each of said plurality of vertical transistors comprising a pillar of semiconductor material formed in a semiconductor substrate, a first source/drain region on a lower portion of said pillar, a gate structure disposed around said pillar above said first source/drain region, and a second source/drain region on a top portion of said pillar above said gate structure;
   a first bottom electrode defined in said semiconductor substrate and connecting said first source/drain regions of said first and second pull-up transistors;
   a second bottom electrode defined in said semiconductor substrate and connecting said first source/drain regions of said first and second pull-down transistors;
   a first shared contact connecting said second source/drain region of said second pull-up transistor to said gate structure of said first pull-up transistor;
   a second shared contact connecting said second source/drain region of said first pull-down transistor to said gate structure of said second pull-down transistor;
   a first top electrode connected to said second source/drain regions of said first pass gate transistor, said first pull-up transistor, and said second shared contact to define a first storage node of said memory cell; and
   a second top electrode connected to said second source/drain regions of said second pass gate transistor, said second pull-down transistor, and said first shared contact to define a second storage node of said memory cell.

2. The memory cell of claim 1, further comprising:
   a first routing gate connecting said gate structures of said first and second pass gate transistors;
   a word line; and
   a first via connecting said word line to said first routing gate, wherein said first and second top electrodes are positioned parallel to said word line and said word line is positioned between said first and second top electrodes.

3. The memory cell of claim 2, further comprising:
   a third bottom electrode defined in said semiconductor substrate and connected to said first source/drain regions of said first pass gate transistor;
   a fourth bottom electrode defined in said semiconductor substrate and connected to said first source/drain regions of said second pass gate transistor;
   first and second bit lines;
   a second via connecting said first bit line to said third bottom electrode; and
   a third via connecting said second bit line to said fourth bottom electrode.

4. The memory cell of claim 3, further comprising:
   first and second supply lines;
   a fourth via connecting said first bottom electrode to said first supply line; and
   a fifth via connecting said second bottom electrode to said second supply line.

5. The memory cell of claim 4, wherein said first and second bit lines and said first and second supply lines are parallel to one another.

6. The memory cell of claim 2, further comprising:
   a second routing gate connecting said gate structures of said first pull-up transistor and said first pull-down transistor; and
   a third routing gate connecting said gate structures of said second pull-up transistor and said second pull-down transistor.

7. The memory cell of claim 6, further comprising:
   a fourth routing gate connected to said gate structure of said second pull-up transistor, wherein said fourth routing gate is connected to said first shared contact; and
   a fifth routing gate connected to said gate structure of said first pull-up transistor, wherein said fifth routing gate is connected to said second shared contact.

8. The memory cell of claim 1, further comprising:
   first and second supply lines;
   a first via connecting said first bottom electrode to said first supply line; and
   a second via connecting said second bottom electrode to said second supply line.

9. The memory cell of claim 8, wherein said first supply line comprises a VDD line and said second supply line comprises a VSS supply line.

10. A memory cell, comprising:
    a plurality of vertical transistors including first and second pass gate transistors, first and second pull-up transistors, and first and second pull-down transistors, each of said plurality of vertical transistors comprising a pillar of semiconductor material formed in a semiconductor substrate, a first source/drain region on a lower portion of said pillar, a gate structure disposed around said pillar above said first source/drain region, and a second source/drain region on a top portion of said pillar above said structure;
a first bottom electrode defined in said semiconductor substrate and connecting said source/drain regions of said first and second pull-up transistors;
a second bottom electrode defined in said semiconductor substrate and connecting said source/drain regions of said first and second pull-down transistors;
a first routing gate connecting said gate structures of said first pull-up transistor and said first pull-down transistor;
a second routing gate connecting said gate structures of said second pull-up transistor and said second pull-down transistor;
a third routing gate connected to said gate structure of said second pull-up transistor;
a fourth routing gate connected to said gate structure of said first pull-up transistor;
a first shared contact connecting said second source/drain region of said second pull-up transistor and said third routing gate;
a second shared contact connecting said second source/drain region of said first pull-down transistor to said fourth routing gate;
a first top electrode connected to said second source/drain regions of said first pass gate transistor and said first pull-up transistor, and to said second shared contact to define a first storage node of said memory cell; and
a second top electrode connected to said second source/drain regions of said second pass gate transistor and said second pull-down transistor, and to said first shared contact to define a second storage node of said memory cell.

11. The memory cell of claim 10, further comprising:
a third bottom electrode defined in said semiconductor substrate and connected to said source/drain regions of said first pass gate transistor;
a fourth bottom electrode defined in said semiconductor substrate and connected to said source/drain regions of said second pass gate transistor;
a fifth routing gate connecting said gate structures of said first and second pass gate transistors;
first and second bit lines;
a word line;
a first via connecting said first bit line to said third bottom electrode;
a second via connecting said second bit line to said fourth bottom electrode; and
a third via connecting said word line to said first routing gate, wherein said first and second top electrodes are positioned parallel to said word line and said word line is positioned between said first and second top electrodes.

12. A method, comprising:
forming a plurality of vertical transistors including first and second pass gate transistors, first and second pull-up transistors, and first and second pull-down transistors, each of said plurality of vertical transistors comprising a pillar of semiconductor material formed in a semiconductor substrate, a first source/drain region on a lower portion of said pillar, a gate structure disposed around said pillar above said first source/drain region, and a second source/drain region on a top portion of said pillar above said gate structure;
forming a first bottom electrode defined in said semiconductor substrate and connecting said source/drain regions of said first and second pull-up transistors;
forming a second bottom electrode defined in said semiconductor substrate and connecting said source/drain regions of said first and second pull-down transistors;
forming a dielectric layer between said plurality of vertical transistors;
forming a first shared contact embedded in said dielectric layer and connecting said second source/drain region of said second pull-up transistor to said gate structure of said first pull-up transistor;
forming a second shared contact embedded in said dielectric layer and connecting said second source/drain region of said first pull-down transistor to said gate structure of said second pull-down transistor;
forming a first top electrode embedded in said dielectric layer and connected to said second source/drain regions of said first pass gate transistor, said first pull-up transistor, and said second shared contact to define a first storage node of said memory cell; and
forming a second top electrode embedded in said dielectric layer and connected to said second source/drain regions of said second pass gate transistor, said second pull-down transistor, and said first shared contact to define a second storage node of said memory cell.

13. The method of claim 12, further comprising:
forming a first routing gate embedded in said dielectric layer and connecting said gate structures of said first and second pass gate transistors;
forming a word line; and
forming a first via embedded in said dielectric layer and connecting said word line to said first routing gate, wherein said first and second top electrodes are positioned parallel to said word line and said word line is positioned between said first and second top electrodes.

14. The method of claim 13, further comprising:
forming a third bottom electrode in said semiconductor substrate that is connected to said source/drain regions of said first pass gate transistor;
forming a fourth bottom electrode in said semiconductor substrate that is connected to said source/drain regions of said second pass gate transistor;
forming first and second bit lines;
forming a second via embedded in said dielectric layer and connecting said first bit line to said third bottom electrode; and
forming a third via embedded in said dielectric layer and connecting said second bit line to said fourth bottom electrode.

15. The method of claim 14, further comprising:
forming first and second supply lines;
forming a fourth via embedded in said dielectric layer and connecting said first bottom electrode to said first supply line; and
forming a fifth via embedded in said dielectric layer and connecting said second bottom electrode to said second supply line.

16. The method of claim 15, wherein said dielectric layer comprises a first dielectric layer, and said first and second bit lines and said first and second supply lines are parallel to one another and are embedded in a second dielectric layer formed above said first dielectric layer.

17. The method of claim 14, further comprising:

forming a second routing gate embedded in said dielectric layer and connecting said gate structures of said first pull-up transistor and said first pull-down transistor; and forming a third routing gate embedded in said dielectric layer and connecting said gate structures of said second pull-up transistor and said second pull-down transistor.

18. The method of claim 17, further comprising:

forming a fourth routing gate embedded in said dielectric layer and connected to said gate structure of said second pull-up transistor;

forming a fifth routing gate connected to said gate structure of said first pull-up transistor;

forming a first opening in said dielectric layer exposing a first portion of said fourth routing gate and said second source/drain region of said second pull-up transistor;

forming a second opening in said dielectric layer exposing a second portion of said fifth routing gate and said second source/drain region of said first pull-up transistor;

forming said first shared contact in said first opening; and forming said second shared contact in said second opening.

19. The method of claim 12, further comprising:

forming first and second supply lines;

forming a first via embedded in said dielectric layer and connecting said first bottom electrode to said first supply line; and forming a second via embedded in said dielectric layer and connecting said second bottom electrode to said second supply line.

20. The method of claim 19, wherein said first supply line comprises a VDD line and said second supply line comprises a VSS supply line.

* * * * *